(12) United States Patent
Stiepan et al.

(10) Patent No.: US 12,288,706 B2
(45) Date of Patent: Apr. 29, 2025

(54) PARAMETERIZING X-RAY SCATTERING MEASUREMENT USING SLICE-AND-IMAGE TOMOGRAPHIC IMAGING OF SEMICONDUCTOR STRUCTURES

(71) Applicant: Carl Zeiss SMT GmbH, Oberkochen (DE)

(72) Inventors: Hans Michael Stiepan, Aalen (DE); Thomas Korb, Schwaebisch Gmuend (DE); Eugen Foca, Ellwangen (DE); Alex Buxbaum, San Ramon, CA (US); Dmitry Klochkov, Schwaebisch Gmuend (DE); Jens Timo Neumann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 390 days.

(21) Appl. No.: 17/729,385

(22) Filed: Apr. 26, 2022

(65) Prior Publication Data

US 2023/0343619 A1      Oct. 26, 2023

(51) Int. Cl.
| | | |
|---|---|---|
| *H01L 21/67* | (2006.01) | |
| *G01N 23/046* | (2018.01) | |
| *G01N 23/083* | (2018.01) | |
| *G01N 23/20* | (2018.01) | |
| *G06T 7/00* | (2017.01) | |

(52) U.S. Cl.
CPC ..... *H01L 21/67288* (2013.01); *G01N 23/046* (2013.01); *G01N 23/083* (2013.01); *G01N 23/20083* (2013.01); *G06T 7/0006* (2013.01); *G06T 7/001* (2013.01); *G01N 2223/04* (2013.01); *G01N 2223/045* (2013.01); *G01N 2223/401* (2013.01); *G01N 2223/6116* (2013.01); *G06T 2207/10081* (2013.01); *G06T 2207/30148* (2013.01)

(58) Field of Classification Search
None
See application file for complete search history.

(56) References Cited

U.S. PATENT DOCUMENTS

| 11,867,595 | B2 * | 1/2024 | Liu | G01B 15/08 |
| 2004/0129897 | A1 * | 7/2004 | Adachi | G01N 1/286 |
| | | | | 250/311 |

(Continued)

FOREIGN PATENT DOCUMENTS

| WO | WO 2020/244795 A1 | 12/2020 |
| WO | WO 2021/180600 A1 | 9/2021 |

OTHER PUBLICATIONS

Fan, R. Ranjit, A. Thurber, D. Engelhard, "High resolution profiles of 3D NAND pillars using x-ray scattering metrology," Proc. SPIE 11611, Metrology, Inspection, and Process Control for Semiconductor Manufacturing XXXV, 116110S (Feb. 22, 2021).

(Continued)

*Primary Examiner* — Darryl V Dottin
(74) *Attorney, Agent, or Firm* — Fish & Richardson P.C.

(57) ABSTRACT

Semiconductor structures can be investigated, e.g., in an in-line quality check. An x-ray scattering measurement, e.g., CD-SAXS, can be used for wafer metrology. The x-ray scattering measurement can be configured based on a slice-and-imaging tomographic measurement using a dual-beam device, e.g., including a focused ion beam device and a scanning electron microscope.

16 Claims, 8 Drawing Sheets

(56) References Cited

U.S. PATENT DOCUMENTS

| | | | |
|---|---|---|---|
| 2019/0049602 A1* | 2/2019 | Hench | G01N 23/201 |
| 2019/0179040 A1* | 6/2019 | Luu | G01T 1/2985 |
| 2023/0115376 A1* | 4/2023 | Klochkov | G05B 15/02 |
| | | | 382/149 |

OTHER PUBLICATIONS

Neumann, Jens Timo, et al. "3D analysis of high-aspect ratio features in 3D-NAND." *Metrology, Inspection, and Process Control for Microlithography XXXIV*. vol. 11325. International Society for Optics and Photonics, 2020.

* cited by examiner

PARAMETERIZING X-RAY SCATTERING MEASUREMENT USING SLICE-AND-IMAGE TOMOGRAPHIC IMAGING OF SEMICONDUCTOR STRUCTURES

FIELD

Various examples of the disclosure generally pertain to x-ray scattering measurements performed on wafers that include semiconductor structures. Various examples specifically relate to parameterizing such x-ray scattering measurements using three-dimensional volume images obtained from tomographic measurements.

BACKGROUND

Manufacturing of semiconductor structures generally relies on the precise monitoring of the individual process steps of a production line: Even minute deviations from the desired structure properties in a process step of the production line may lead to a drop of the is overall yield. Process deviations are generally desired to be revealed early on in the production line.

For this, in-line wafer metrology can be used. Here, metrology steps—i.e., measurements to determine properties of semiconductor structures—are inserted between at least some manufacturing process steps (in-line quality check), to control the stability of the foregoing process step.

On the other hand, the manufacturers rely on maintaining the throughput and generally cannot afford to queue up wafers for getting through a metrology tool.

Thus, fast measurements are usually desirable for in-line quality checks.

For three-dimensional (3-D) NAND high aspect ratio (HAR) structures, critical dimension small-angle x-ray scattering measurements (CD-SAXS) is discussed as a method to monitor the geometrical properties of the pillar shaped memory cell chains. See, e.g., Fan, R. Ranjit, A. Thurber, D. Engelhard, "High resolution profiles of 3D NAND pillars using x-ray scattering metrology," Proc. SPIE 11611, Metrology, Inspection, and Process Control for Semiconductor Manufacturing XXXV, 116110S (22 Feb. 2021).

Besides 3D NAND other novel structures with HAR such as 3D-DRAM are expected to be used in the near future. Those structures will also need to be measured with advanced metrology tools like CD-SAXS.

CD-SAXS can be fast enough for inline metrology, i.e., enabling an in-line quality check, and being sensitive to shape deviations.

However, using CD-SAXS measurements for in-line quality checks can have certain restrictions and drawbacks.

Firstly, the extraction of the deviations of the geometry of semiconductor structures generally relies on the fitting or matching of the actual/measured scattering patterns (measurement spectra) to pre-calculated scattering patterns (reference spectra); these reference spectra are associated with a set of pre-defined deviations of the geometry of the semiconductor structures (shape deviation). By finding a best match, the particular shape deviation can be determined. Sometimes, multiple different shape deviations (or generally multiple different parameter deviations) can result in the same variation of a given reference spectrum. Thus, reference spectra may not always unambiguously resolve the semiconductor structure geometries. Since unexpected deviations are not pre-calculated, a fitting will usually fail in such cases.

Secondly, CD-SAXS generally can give only the average shape deviation of any periodically arranged semiconductor structures; however, information on the actual span of variations within the field of view of the CD-SAXS measurement are captured in the measurement spectrum. Since wafers or specifically chips usually have some other structure beneath or above a certain monitored semiconductor structure, the measurement spectrum also includes a respective background contribution. This can limit the possibility to assess shape deviations of the semiconductor structure where it is not possible to separate foreground and background contributions to a measurement spectrum.

SUMMARY

Accordingly, there is a need for advanced techniques of parametrizing x-ray scattering measurements. Specifically, a need exists for techniques which overcome or mitigate at least some of the above-identified drawbacks and restrictions.

Hereinafter, techniques of wafer metrology will be disclosed.

According to examples, one or more parameter values associated with an x-ray scattering measurement for wafer metrology can be determined. This can be based on three-dimensional volume images of semiconductor structures. Also, an in-line wafer metrology using the x-ray scattering measurement can be executed based on the one or more parameter values.

A method of wafer metrology is disclosed. The method includes performing a slice-and-image tomographic measurement to obtain one or more three-dimensional volume images of a wafer including semiconductor structures. The method also includes parameterizing an x-ray scattering measurement based on the one or more three-dimensional volume images. Further, the method includes, upon parameterizing the x-ray scattering measurement, performing the x-ray scattering measurement to obtain one or more measurement spectra of the wafer or one or more further wafers including the semiconductor structures or further semiconductor structures.

A computer program or a computer-program product or a computer-readable storage medium includes program code. The program code can be loaded and executed by at least one processor. Upon executing the program code, the at least one processor performs a method of wafer metrology. The method includes performing a slice-and-image tomographic measurement to obtain one or more three-dimensional volume images of a wafer including semiconductor structures. The method also includes parameterizing an x-ray scattering measurement based on the one or more three-dimensional volume images. Further, the method includes, upon parameterizing the x-ray scattering measurement, performing the x-ray scattering measurement to obtain one or more measurement spectra of the wafer or one or more further wafers including the semiconductor structures or further semiconductor structures.

A processing device is disclosed. The processing device includes a processor and a memory, the processor being configured to load program code from the memory and execute the program code. The processor, upon executing the program code, is configured to perform a slice-and-image tomographic measurement to obtain one or more three-dimensional volume images of a wafer including semiconductor structures. The processor is also configured to parameterize an x-ray scattering measurement based on the one or more three-dimensional volume images. The processor is further configured to perform the x-ray scattering measurement upon parameterizing the x-ray scattering measurement, to obtain one or more measurement spectra of the wafer or one or more further wafers including the semiconductor structures or further semiconductor structures.

It is to be understood that the features mentioned above and those yet to be explained below may be used not only in the respective combinations indicated, but also in other combinations or in isolation without departing from the scope of the disclosure.

DETAILED DESCRIPTION

Figure 1:
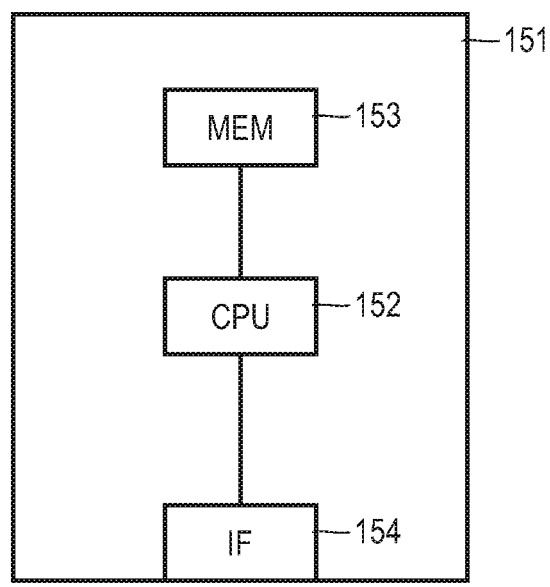
FIG. 1 schematically illustrates a processing device according to various examples.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and is other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the disclosure will be described in detail with reference to the accompanying drawings. It is to be understood that the following description of embodiments is not to be taken in a limiting sense. The scope of the disclosure is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein to may also be implemented by an indirect connection or coupling. A coupling between components may also be established over a wireless connection. Functional blocks may be implemented in hardware, firmware, software, or a combination thereof.

Hereinafter, techniques of making measurements on semiconductor wafers that include semiconductor structures are disclosed. For instance, a geometry or a variation of a geometry or a deviation of the geometry with respect to a reference geometry (shape deviation) of the semiconductor structures can be determined based on such measurements.

The techniques are suitable for facilitating in-line metrology. High-throughput/fast measurements are disclosed. Nonetheless, a high accuracy based on accurate parameterization of the measurement is enabled.

Hereinafter, techniques for measuring wafers including semiconductor structures using x-ray scattering measurements are disclosed. For instance, a CD-SAXS measurement can be employed. CD-SAXS uses high-energy x-rays that, e.g., penetrate through a wafer. Also, reflection measurements would be possible. These different measurement configurations are sometimes referred to as transmission SAXS (T-SAXS) and Grazing-Incidence SAXS (GI-SAXS). Measurement spectra can be obtained for a variety of azimuth angles and various angles of incidence. The CD-SAXS can then provide measurement spectra. These measurement spectra can be matched to one or more reference spectra. If a match between a measurement spectrum and a reference spectrum is found, it can be assumed that the underlying imaged objects associated with, both, the matching measurement spectrum as well as the matching reference spectrum correspond to each other. In other words, it is possible to determine a geometry of the semiconductor structures imaged by the CD-SAXS based on the one or more measurement spectra.

As a general rule, a measurement spectrum can include multiple contributions: firstly, a foreground contribution associated with the particular geometry of the semiconductor structures under investigation. Secondly, a background contribution associated with other semiconductor structures on the wafer and within the field of view. For instance, such other semiconductor structures could be arranged in other layers of the wafer above or beneath the semiconductor structures under investigation. Thirdly, it would be possible that a contribution associated with a variation of the geometry of the semiconductor structures under investigation is included in the measurement spectrum. Specifically, within the field of view, the semiconductor structures may have a certain varying geometry—e.g., due to process variability of the manufacturing process. For instance, such variation of the geometry can be expressed by a blurring of certain scattering peaks in the measurement spectrum. A width of the scattering peaks can be associated with the variation of the geometry.

While hereinafter various scenarios will be disclosed with the specific use of CD-SAXS, similar techniques may be readily applied for different types of x-ray scattering measurements, e.g., large-angle x-ray scattering measurements or x-ray scattering measurements in reflection rather than transmission.

As a general rule, various kinds and types of semiconductor structures can be imaged. For instance, a three-dimensional (3-D) memory chip could be imaged, e.g., VNAND or 3-D Ram. 3-D DRAM would be another example; here, the memory unit cell includes a cylindric capacitor and buried logic. 3-D memory chips (VNAND or 3D RAM) are composed of many pillar-like structures running parallel to each other and sometimes referred to as memory channels or "pillars". Deep-etched memory channel holes crossing multiple layers, e.g., different conducting (e.g., metallization) layers or isolation layers, of the wafer can be imaged.

Hereinafter, techniques will be disclosed which facilitate parametrizing CD-SAXS spectra or generally the measured signal. This means that one or more parameter values of one or more parameters associated with such CD-SAXS spectra can be set using techniques as disclosed herein.

According to various examples, it is possible to employ a slice-and-image tomographic measurement for parametrizing CD-SAXS. For instance, a 3-D volume image of semiconductor structures on a nm scale can be obtained through the so-called slice-and-image tomographic measurement that can be implemented using a dual-beam device (DBD). In a DBD, two particle optical systems are arranged at an angle (column offset angle). The is two particle optical systems might be oriented perpendicularly or at a column offset angle between 45° and 90°. The first particle optical system defines an imaging column. The imaging column can be implemented by a scanning electron microscope (SEM) or a helium-ion microscope (HIM). The second particle optical system defines a milling column. The milling column can be a focused ion beam (FIB) optical system, using for example Gallium (Ga) ions. The FIB of Ga ions are used to cut off slices of a test volume of the wafer, slice-by-slice. Thereby, images depicting cross-sections of the wafer are obtained at different milling depths, using the imaging column.

An example implementation of the slice-and-image tomographic measurement is described in: Neumann, Jens Timo, et al. "3D analysis of high-aspect ratio features in 3D-NAND." *Metrology, Inspection, and Process Control for Microlithography XXXIV*. Vol. 11325. International Society for Optics and Photonics, 2020.

Slice-and-image tomographic measurements are also described in WO 2021180600 A1 which is incorporated by reference.

The slice-and-image tomographic measurement allows for sectioning and imaging of a small piece of a wafer, e.g., a set of 3-D NAND structures, and to measure the geometry of each semiconductor structure in the field-of-view. The slice-and-image tomographic measurement gives a measure of the actual variability of the shapes from semiconductor structure to semiconductor structure. The slice-and-image tomographic measurement is destructive and—compared to CD-SAXS—very slow; but it complements CD-SAXS well.

According to various examples, while the CD-SAXS measurement is executed in-line of a production line—e.g., to thereby provide for an in-line quality check of the semiconductor structures within the production line (e.g., to track a variation of geometries of the semiconductor structures across different wafers or across different positions on a wafer); the slice-and-image tomographic measurement is executed out-of-line of the production line; but, e.g., in an inline-attached mode, i.e., triggered by one an in-line quality check implemented based on in-line metrology.

Using the slice-and-image tomographic measurement, different kinds and types of parameters of the CD-SAXS can be set, according to the examples disclosed herein. Some options are summarized below in TAB. 1.

TABLE 1 multiple options for parametrizing an CD-SAXS based on 3-D volume images of the wafer that include semiconductor structures. Such techniques may be combined with each other. For instance, it would be possible to execute I and/or II, as well as III.

| | BRIEF DESCRIPTION | EXAMPLE DETAILS |
|---|---|---|
| I | Reference spectrum | For instance, the parametrizing of the CD-SAXS measurement can include determining one or more reference spectra for later matching to measurement spectra obtained from executing the CD-SAXS measurement. These reference spectra can provide characteristic fingerprints of the x-ray spectra that are measured using the CD-SAXS for certain reference geometries of the semiconductor structures.<br>Thus, the 3-D volume images can be used to parametrize the shape deviations of the semiconductor structures (e.g., channel tilts for 3-D memory channels or ellipticity) and to define the minimal set of basis shape deviations with associated pre-calculated scattering patterns/reference spectra.<br>Furthermore - since the variability of the geometry of the semiconductor structures is accessible through the slice-and-image tomographic measurement - the CD-SAXS reference spectra can split into multiple contributions, i.e.: (1) "mean" or "average" geometry of semiconductor structures; (2) variation of this "mean" geometry; and (3) background of other structures in the wafer.<br>It would be possible to determine one or more reference spectra based on the geometry of semiconductor structures and, optionally, the variation of the geometry. It would be possible to determine a background contribution to the one or more reference spectra associated with the other (semiconductor) structures, as well as a foreground contribution associated with the semiconductor structures under investigation.<br>Such variation of the geometry may manifest itself in a blurring of peaks and/or altogether different spectra, depending on whether the variation of the geometry occurs within a field-of- |

TABLE 1-continued multiple options for parametrizing an CD-SAXS based on 3-D volume images of the wafer that include semiconductor structures. Such techniques may be combined with each other. For instance, it would be possible to execute I and/or II, as well as III.

| | BRIEF DE-SCRIPTION | EXAMPLE DETAILS |
|---|---|---|
| | | view of the CD-SAXS or the variation of geometry occurs for different positions across a wafer or multiple wafers. It would then be possible to make a comparison between actual measured spectra of the CD-SAXS with the one or more reference spectra to find a best matching reference spectrum; then, the underlying geometry associated with this best-matching reference spectrum can be assumed to constitute the measured sample. The one or more reference spectra can be determined by building a geometrical model of the scattering object, i.e., including the semiconductor structures according to various geometries within the variability of geometries and the background (e.g., other structures); then, the respective reference spectrum can be calculated, e.g., using ab-initio wave diffraction methods, e.g., using Maxwell's equations. |
| II | Signal model | Sometimes, it may be desirable to build a signal model allowing for prediction of multiple reference spectra under varying imaging conditions. For instance, the x-ray scattering measurement can provide for various imaging parameters (also cf. example III below). The observed measurement spectra typically exhibit a dependency on these imaging parameters. Thus, it can be helpful to build a signal model, specifically, to determine an object transfer function of the signal model associated with the impact of the geometry of the semiconductor structures onto the measured spectra. Then, it is possible to predict various reference spectra using this object transfer function, e.g., by varying the image transfer function of the x-ray measurement apparatus. Using such signal model, not only forward-calculation is possible (i.e., predicting reference spectra), but also a backward-calculation would be possible. This would equate to an inversion of the signal model. Here an observed measurement spectrum can be used as an input to the calculation to determine the geometry of the semiconductor structures. I.e., the observed measurement spectrum can be broken down into the various contributions, e.g., foreground contribution and background contribution. Then, based on the assumed parametrized object transfer function, the geometrical parameters of the semiconductor structures that explain well the measurement spectrum can be determined, e.g., using an iterative numerical optimization that minimizes a loss function associated with a mismatch between the observed signal and the respective predicted signal. To avoid ambiguities in the reference spectra - that may manifest itself in local minima of the loss - a regularization may be used. As a general rule, a forward-calculation of a set of relevant reference spectra is typically much faster than a backward-calculation. Thus, in terms of high-throughput in-line metrology, it can be desirable to a priori determine a set of relevant reference spectra using forward calculation; rather than using backward calculation. |
| III | Imaging parameter | For instance, the parametrizing of the CD-SAXS can include setting one or more imaging parameters of the CD-SAXS. To give just a few examples, it would be possible to determine values for one or more of the following imaging parameters: acceleration voltage; wavelength; incidence angle and/or azimuth angle; diffraction order, e.g., of the detected x-ray; polarization; flux; beam shape; angle variation; etc. |

Various techniques are based on the finding that it is generally desirable to make a good pre-selection of expected shape deviations of the semiconductor structures to keep the set of reference spectra slim and stable instead of blowing up the database of reference spectra with any kind of thinkable deviation. In reference techniques, identifying relevant deviations of the geometry of the semiconductor structures as well as setting up a proper measurement recipe is time-consuming and takes many iterative steps especially as long as the underlying process in the manufacturing process is not stable or under development. By using the slice-and-image tomographic measurement to determine the geometry or even geometry variation of the semiconductor structures, it is possible to determine the relevant reference spectra for an accurate CD-SAXS (cf. TAB. 1: example I). A good calibration of a signal model is also available (cf. TAB. 1: example II).

Furthermore, by appropriately setting one or more imaging parameters of the CD-SAXS (cf. TAB. 1: example III), it is possible to determine characteristic reference spectra that allow a unique conclusion on the underlying shape deviation observed for the semiconductor structures. In other words, it is possible to resolve ambiguities otherwise inherently present in the measurement and reference spectra by appropriately setting one or more imaging parameters. Thus, generally, it is possible to tune the imaging parameter values to be especially sensitive to certain shape variation or aim for the opposite, depending on process window considerations.

For example, one way of revealing such ambiguities would be to calculate multiple reference spectra (cf. TAB. 1, example I) using different object transfer functions for varying geometries of the semiconductor structures, but using the same image/optics transfer function of the x-ray measurement apparatus (cf. TAB. 1, example II). Generally, a transfer function can specify how different spatial frequencies are handled by the system, e.g., either the object or the optics/imaging system. The transfer function can consider phase and amplitude changes for the different spatial frequencies and wavelengths of electromagnetic waves. Then, the input wavelength spectrum of the x-ray source can be used to predict the output wavelength spectrum. Then, the different reference spectra can be compared with each other. In case they do not differ (i.e., ambiguities are present), the same test can be re-executed with a different image transfer function (due to a change in the imaging parameters, cf. TAB. 1, example III), until a sufficient difference in the multiple reference spectra obtained for varying geometries of the semiconductor structures is observed due to the appropriate choice of the imaging parameters (and along with this the image transfer function). This would mean that the ambiguities are resolved.

At least two modes of operation for parameterizing the CD-SAXS measurement based on the slice-and-image tomographic measurement are conceivable. These modes are summarized in TAB. 2 below.

TABLE 2 multiple operating modes for the slice-and-image tomographic measurement and CD-SAXS interaction.

| Mode | EXAMPLE DETAILS |
|---|---|
| I Initial parameterization | Here, it is possible to determine an initial parameterization of the CD-SAXS, e.g., an initial set of reference spectra and/or an initial set of values for one or more imaging parameters, cf. TAB. 1. For instance, during process design phase, it would be possible to assess the shape variation of the geometry of semiconductor structures and to initially parametrize the CD-SAXS, before starting a production line.<br>Typically, such slice-and-image tomography measurement would be performed out-of-line of a manufacturing process. |
| II Inline-attached | Once initially parameterized, the CD-SAXS can be used for executing an in-line quality check of a production line of a manufacturing process of similar semiconductor structures.<br>In one example, so-called "excursion monitoring" could be employed. Here, certain thresholds or constraints can be defined and it can be checked whether the measurement spectra - obtained as part of the in-line quality check - are within these thresholds or constraints. The thresholds or constraints can be determined based on the reference spectra.<br>It would be possible to monitor - as part of the in-line quality check - a match between the measurement spectra obtained for multiple test volumes of the wafer or one or more further wafers - e.g., processed in the production line - using the CD-SAXS, and the reference spectra. Then, depending on the monitoring, it would be possible to selectively repeat performing the slice-and-image tomographic measurement to obtain one or more further 3-D volume images of at least one of the multiple test volumes. The geometry of the semiconductor structures could be determined based on the one or more further 3-D volume images. For repeating the slice-and-image tomographic measurement, the respective wafer can be branched out of the production line (so that other wafers, previously arranged downstream of the branched-out wafer, can overtake the wafer under investigation). This corresponds to an in-line attached implementation of the slice-and-image tomographic measurement. Based on such microscopic investigation of the geometry of the semiconductor structures, a root cause for the mismatch in the measurement and reference spectra can be revealed.<br>For instance, where a significant mismatch in the geometry of the semiconductor structures with previously observed geometries is detected, it would be possible to re-parametrize the CD-SAXS based on the one or more further 3-D volume images. For example, additional reference spectra may be added to the set of reference spectra to also accommodate for the newly observed geometry of the semiconductor structures.<br>As a general rule, it would be possible to monitor the geometry of the semiconductor structures determined based on the one or more measurement spectra of the CD-SAXS based on the initial parameterization. Where a significant deviation is determined, it would then be possible to perform a re-parameterization of the CD-SAXS.<br>This is based on the finding that even if the calibration - mode I - was performed well and, e.g., a suitable set of reference spectra was found, new error patterns may (newly) occur during production. For instance, new, previously unseen shape variations of the geometry of the semiconductor structures may evolve. This may manifest it- |

TABLE 2-continued multiple operating modes for the slice-and-image
tomographic measurement and CD-SAXS interaction.

| Mode | EXAMPLE DETAILS |
|------|-----------------|
|      | self either through a bad match between measurement and reference spectra of CD-SAXS or where an underlying signal model is available, an unreasonable geometry result, e.g., negative thickness of structures fitting the signal best.<br>As a general rule, based on the CD-SAXS measurement, one or more indicators can be determined that are indicative of the result of the CD-SAXS measurement not being reliable. In that case, the wafer can piped-out of the production line into a 3-D tomography measurement system together with an information on the site to be analyzed. Then, an "inline-attached" 3-D tomography measurement can be executed.<br>Then, the 3-D tomography measurement results can be used to update the CD-SAXS shape deviation database. In that sense the 3D tomography system acts as a client to the CD-SAXS system. |

FIG. 1 schematically illustrates a device 151. The device 151 is configured for wafer metrology. For instance, the device 151 could be a personal computer or a server. The device 151 includes a processor 152 and a memory 153. The processor 152 can communicate via a communication interface 154. For instance, the processor 152 may control a dual beam device so as to execute a slice-and-image tomographic measurement. The processor 152 may receive, via the interface 154, one or more 3-D volume images of the wafer based on such slice-and-image tomographic measurement. The processor 152 may control an x-ray measurement device to execute an CD-SAXS. For instance, the processor may provide one or more imaging parameter values to the x-ray measurement device for executing the CD-SAXS. The processor may receive, via the interface 154, one or more measurement spectra of the CD-SAXS. The processor 152 may load program code from the memory 153 and execute the program code. The processor 152, upon executing the program code, may perform one or more techniques as disclosed herein, e.g.: performing a slice-and-image tomographic measurement; parametrizing a CD-SAXS; performing the CD-SAXS; calculating a CD-SAXS signal model; inverting the signal model to determine an observed geometry of semiconductor structures; predicting reference spectra based on the signal model; matching measured spectra to one or more reference spectra; determining a geometry of semiconductor structures based on CD-SAXS; implementing an in-line quality check for semiconductor structures based on CD-SAXS; operating a slice-and-image tomographic measurement in an in-line attached mode and as a slave to an in-line CD-SAXS; etc.

Figure 2:
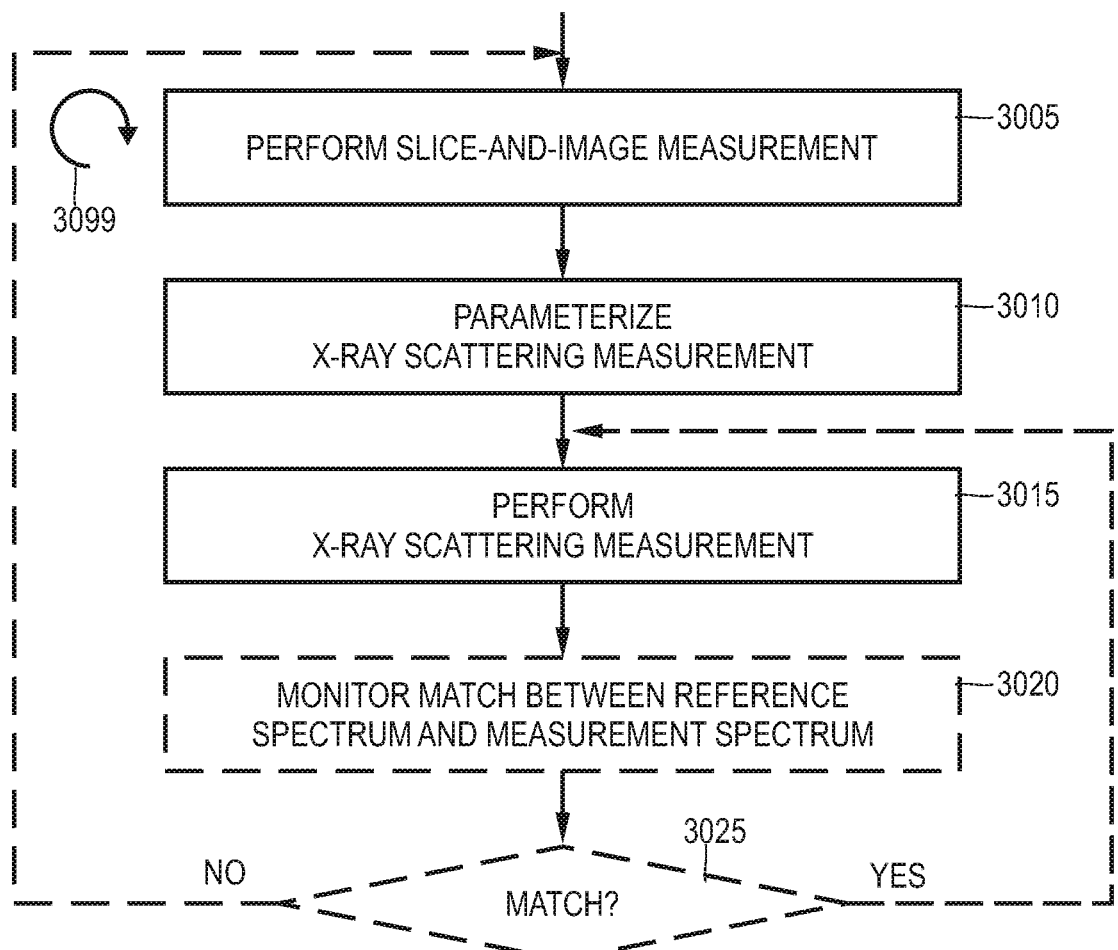
FIG. 2 is a flowchart of a method according to various examples.

FIG. 2 is a flowchart of a method according to various examples. The method of FIG. 2 may be executed by a processing device, e.g., the processing device 151. More specifically, the method of FIG. 2 may be executed by the processor 152, upon loading and executing program code from the memory 153. Optional boxes are shown with dashed lines. At box 3005, a slice-and-image tomographic measurement is performed for a test volume. For this, e.g., control data may be transmitted to a dual beam device to execute the measurement.

As a result, one or more 3-D volume images of the wafer including semiconductor structures are obtained.

For instance, the semiconductor structures can be formed in accordance with a lithography template, e.g., in a lithography process.

Based on the slice-and-image tomographic measurement, a geometry of semiconductor structures can be determined, e.g., a tilt angle, waviness, ellipticity, diameter of deep-etched memory channel holes that cross multiple layers of a wafer. Associated techniques are described in U.S. patent application Ser. No. 17/496,345 which is incorporated herein by reference.

Next, at box 3010, CD-SAXS is parametrized based on the 3-D volume images of box 3005. Where desired, a CD-SAXS reference measurement may be performed prior to box 3005 at the test volume. Multiple options for such parameterization have been disclosed above in connection with TAB. 1.

Briefly, it is possible to determine one or more reference spectra that can provide a basis for matching measurement spectra acquired using the CD-SAXS; for instance, the one or more reference spectra may be determined taking into account a variation of the geometry of the semiconductor structures. Such variation of the geometry may manifest itself in a blurring of peaks and/or altogether different spectra, depending on whether the variation of the geometry occurs within a field-of-view of the CD-SAXS or the variation of geometry occurs for different positions across a wafer or multiple wafers. It would be possible to determine one or more parameters of a model for predicting reference spectra or enabling backward calculations using an inversion of the signal model. Imaging parameters of the CD-SAXS may be set by choosing appropriate values that prevent ambiguous measurement spectra (which would prevent inversion of the signal model).

Next, at box 3015, the CD-SAXS can be performed, upon parametrizing the CD-SAXS in box 3010.

For instance, as part of box 3015, control data may be provided to an x-ray measurement device. The control data could be indicative of one or more imaging parameter values, cf. TAB. 1: example III.

The control data can trigger the x-ray measurement device to execute the CD-SAXS. The CD-SAXS performed at box 3015 may be performed on the same wafer for which the slice-and-image tomographic measurement has been performed at box 3005. It would also be possible that the CD-SAXS at box 3015 is performed for a further wafer or multiple further wafers that include similar semiconductor structures or further semiconductor structures. Such semiconductor structures can be formed in accordance with the same lithography template that has been used for manufacturing the semiconductor structures for which the slice-and-image tomographic measurement has been performed in box 3005.

For instance, as part of box 3015, it would be possible to determine geometrical parameter values (i.e., a geometry) of the semiconductor structures based on one or more measurement spectra that are obtained from the performing of the CD-SAXS.

For instance, for this it would be possible that the one or more measurement spectra are matched to a set of reference spectra that are obtained from, e.g., box 3010. Then, a best match may be identified, and the underlying geometrical parameter values of the semiconductor structures as measured using the slice-and-image tomographic measurement in box 3005 may be assumed to be present.

Specifically, at optional box 3020, it would be possible to monitor a match between one or more reference spectra as obtained from box 3010 and one or more measurement spectra is obtained from box 3015. If a poor match is detected, then, at box 3025, the decision may be made to re-parametrize the CD-SAXS by performing a further iteration 3099 of boxes 3005, 3010, 3015, and 3020 (or at least determine the geometry of the semiconductor structures using the slice-and-image tomographic measurement). For instance, one or more reference spectra may be added to the set/database of reference spectra, wherein the one or more newly-added reference spectra correspond to previously unseen geometries of the semiconductor structures. It is not always necessary to re-parametrize the CD-SAXS; sometimes, it may simply be sufficient to validate the result of the CD-SAXS using the slice-and-image tomographic measurement.

For instance, any subsequent iteration 3099 may correspond to, e.g., an in-line-attached mode as described in TAB. 2: example mode II. In box 3015 and box 3020, a quality check of the semiconductor structures can be implemented, e.g., by checking tolerable deviations of the geometry of the semiconductor structures. Where a poor match between reference and measured spectra is detected—or where a deviation of the geometry of the semiconductor structures beyond a tolerance is detected—the respective wafer may be processed outside of the production line in the dual beam device for the slice-and-image tomographic measurement, but then piped back to the production line. Thus, the slice-and-image tomographic measurement is executed in an in-line attached mode. This is also schematically illustrated in FIG. 3.

Figure 3:
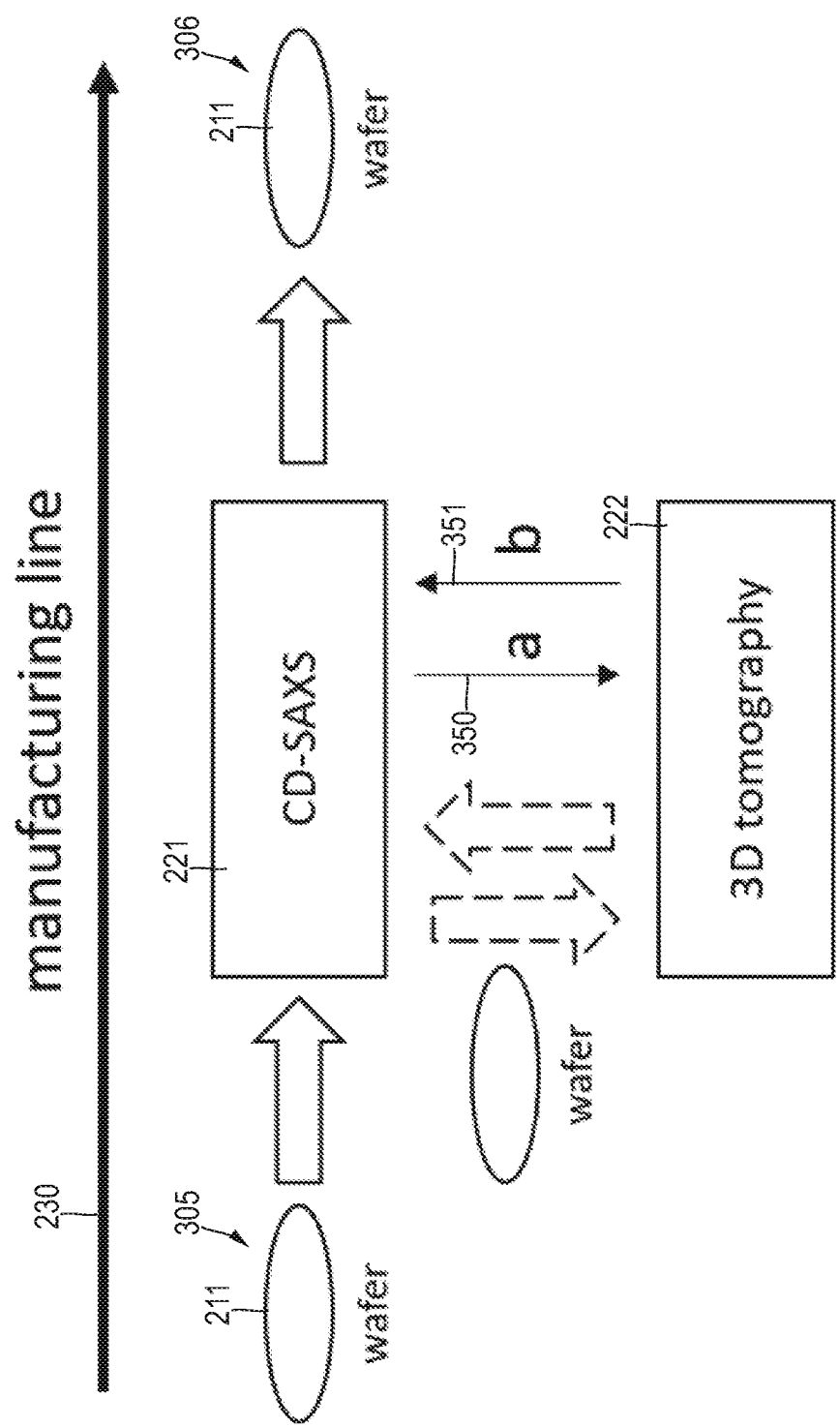
FIG. 3 schematically illustrates an in-line x-ray scattering measurement and an in-line-attached slice-and-image tomographic measurement according to various examples.

FIG. 3 illustrates the manufacturing of semiconductor structures on a wafer 211. Illustrated is a production line 230. As part of the lithography process, in between two processing steps 305, 306, in-line metrology is performed using the CD-SAXS 211. Where a significant deviation is found, it is possible to perform an out-of-line slice-and-image tomographic measurement 222; by removing the wafer 211 from the production line 230. Specifically, it would be possible that the out-of-line slice-and-image tomographic measurement 222 is performed in a region (test volume) of the wafer 211 that shows a significant mismatch between the respective measurement spectrum obtained from the CD-SAXS 222 and respective reference spectra. Respective control data 350 indicative of the test volume may be passed on towards the dual beam device. The slice-and-image tomographic measurement may be configured using respective control data 350.

Then, if the CD-SAXS 222 is re-parametrized, control data 351 may be provided that is indicative of, e.g., one or more further reference spectra and/or adjusted values of one or more imaging parameters.

Figure 4:
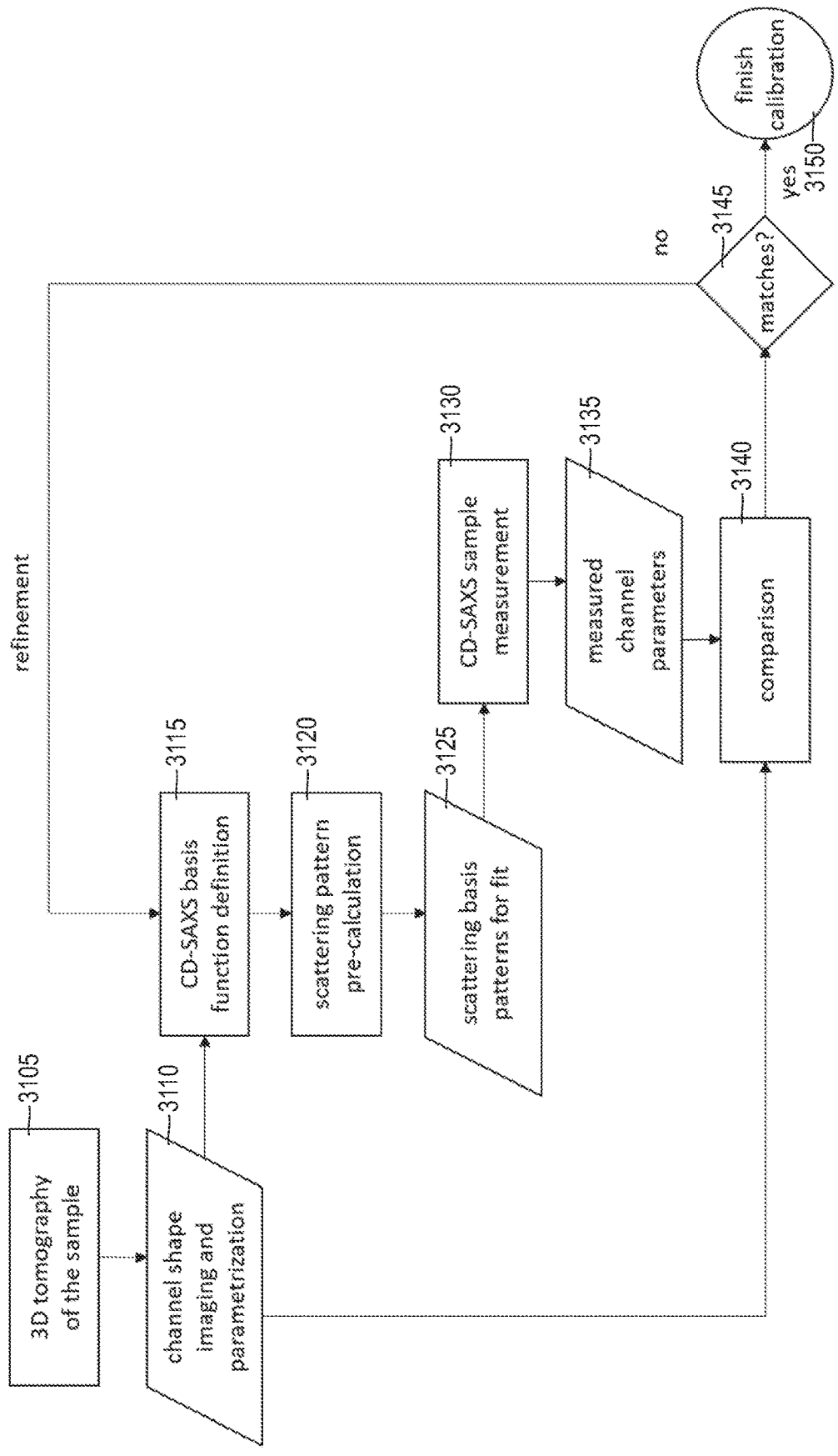
FIG. 4 is a flowchart of a method according to various examples.

FIG. 4 is a flowchart of a method according to various examples. For instance, the method of FIG. 4 may be a concrete implementation of at least a part of method of FIG. 2. FIG. 4 illustrates specifically mode I of TAB. 2.

At box 3105, a slice-and-image tomographic measurement of a wafer that include semi-conductor structures is performed. As such, box 3105 corresponds to box 3005 of the method of FIG. 2.

At box 3110, a geometry of the semiconductor structures is determined. For instance, where a 3D memory channel, i.e., a deep-etched memory channel whole crossing multiple layers—is observed, a tilt angle, ellipticity and/or diameter may be determined. It would be possible to determine a variation of the geometry of the semiconductor structures across the respective one or more 3D volume images.

Based on such information, one or more basis functions of the CD-SAXS can be determined (e.g., selected or defined) at box 3115. I.e., an object transfer function of a signal model of x-ray scattering can be determined.

Accordingly, box 3120, it would then be possible to select certain geometries of the semiconductor structures within the variation of geometries for which distinct object transfer functions of the x-ray scattering process are calculated.

It would then be possible to add to, to such object transfer functions, contributions of the background. Such background can stem from further semiconductor structures that have been prefabricated on the wafer and that are not subject to the in-line metrology scope of the CD-SAXS. Also, the image transfer function of the imaging system can be considered. All this yields a signal model.

Thus, a respective pre-calculation of the reference spectra can be executed at box 3120.

Then, based on the signal model, at box 3125, it is possible to calculate the reference spectrum or reference spectra of the CD-SAXS. Each reference spectrum of a respective set of reference spectra can correspond to a certain geometry of the semiconductor structures, within the variation of geometries as determined in box 3110. In some scenarios, it may also be possible to accommodate for a variation of the values of the imaging parameters; e.g., where the angle of the small-angle CD-SAXS changes, also the reference spectrum changes, even if the geometry of the semiconductor structures remains the same.

Then, at box 3130, it is possible to perform the CD-SAXS based on this parameterization. Accordingly, boxes 3115, 3120, 3125 correspond to a box 3010 of the method of FIG. 2; and box 3130 of FIG. 4 corresponds to box 3015 of the method of FIG. 2. The CD-SAXS performed at box 3130 could be performed as an in-line metrology. For instance, the same semiconductor structures (in a different part of the wafer) of further semiconductor structures could be measured.

Then, at box 3135, it is possible to determine the geometry of these image semiconductor structures of box 3130, based on the CD-SAXS (e.g., a tilt of a memory channel). For instance, one or more measurement spectra is obtained from box 3130 can be compared against a set of reference spectra as determined in box 3125. A backward-calculation would be possible if the signal model is available in parameterized form, i.e., allowing to extract an impact of the geometry of the semiconductor structures on the observed signal.

Then, a comparison can be implemented at box 3140, between the geometry of the semiconductor structures determined based on the slice-and-image tomographic measurement and the geometry of the semiconductor structures determined from CD-SAXS using the current parameterization. If there is a poor match, then it would be possible to further reis fine the parameterization at a further iteration of box 3115 etc. Else, the parameterization of the CD-SAXS can be assumed to be finished, box 3150.

Next, further details with respect to the slice-and-image measurement will be described.

A common way to generate 3D tomographic data from semiconductor samples on nm scale is the so-called slice-and-image measurement performed for example by a dual beam device. A slice-and-image measurement is described in WO 2020/244795 A1. According to the method of the WO 2020/244795 A1, a 3-D volume inspection is obtained at an inspection sample extracted from a semiconductor wafer. This method has the disadvantage that a wafer has to be destroyed to obtain an inspection sample. Recently, for the investigation of 3-D inspection volumes in semiconductor wafers, a slice and imaging method has been proposed, which is applicable to inspection volumes inside a wafer. Thereby, a 3-D volume image is generated at an inspection volume inside a wafer in the so called "wedge-cut" approach or wedge-cut geometry, without the need of a removal of a sample from the wafer. The slice-and-image measurement is applied to an inspection volume with dimensions of few μm, for example with a lateral extension of 5 μm to 10 μm or up to 50 μm in wafers with diameters of 200 mm or 300 mm. A V-shaped groove or edge is milled in the top surface of an integrated semiconductor wafer to make accessible a cross-section surface at a slanted angle to the top surface. 3-D volume images of inspection volumes are acquired at a limited number of measurement sites, for example representative sites of dies, for example at process control monitors (PCM), or at sites identified by other inspection tools. The slice and image method will destroy the wafer only locally, and other dies may still be used, or the wafer may still be used for further processing. The methods and inspection systems according to the 3D Volume image generation are described in WO 2021/180600 A1, which is fully incorporated herein by reference. The techniques disclosed herein are an improvement and extension to the methods and inspection systems according to the 3-D Volume image generation, where a higher throughput is desired.

The techniques disclosed herein are applicable for semiconductor devices including of semiconductor structures with high aspect ratio and/or located in multiple layers inside the device. Manufacturing of such devices strongly relies on the ability to characterize the semiconductor structures in 3-D. The combination of CD-SAXS and slice-and-image measurement facilitate fast and accurate characterization.

Figure 5:
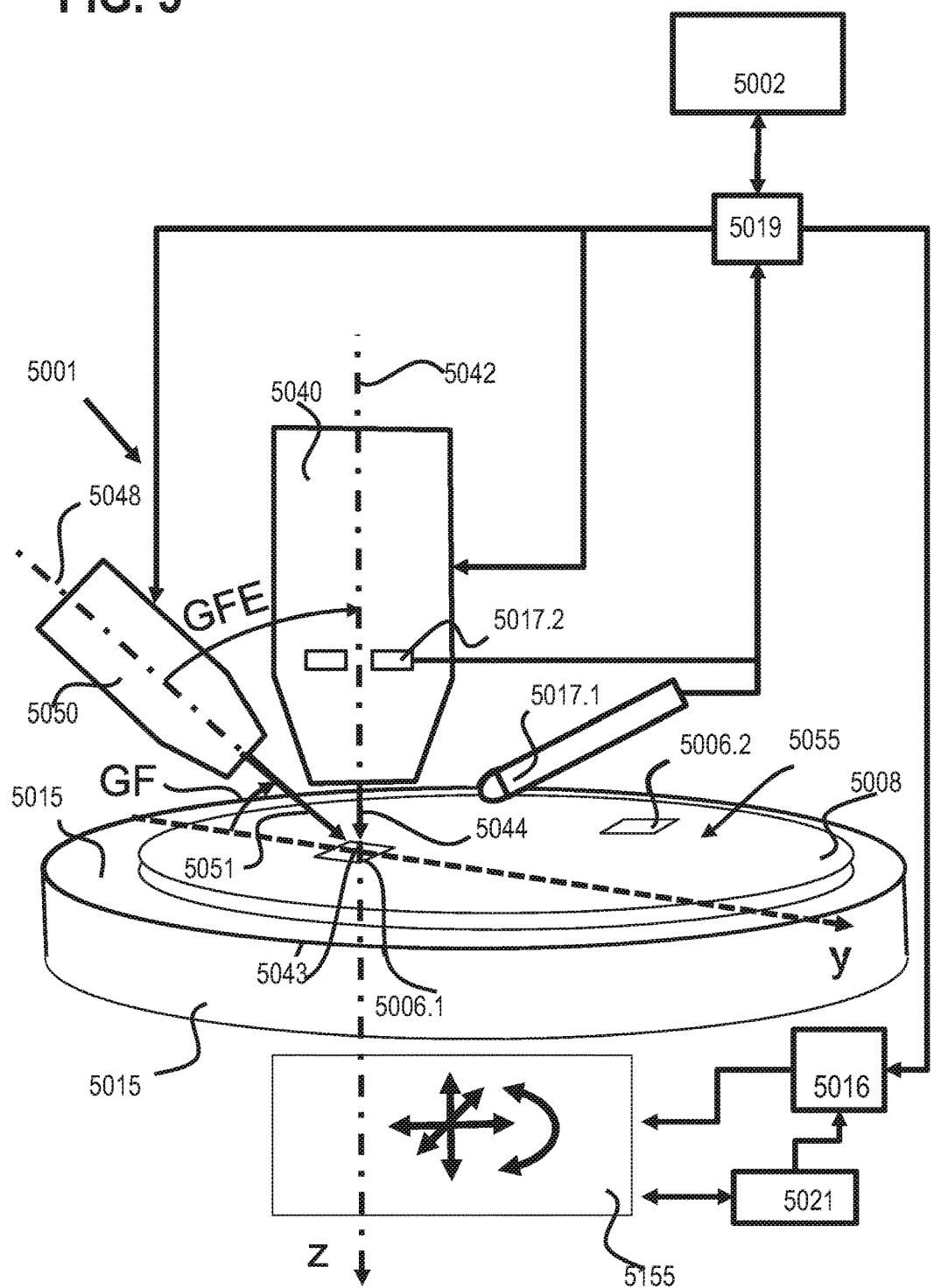
FIG. 5 schematically illustrates a dual beam device according to various examples.

An inspection system is illustrated in FIG. 5. The wafer inspection system 5000 is configured for a slice- and imaging method under wedge cut geometry with a dual beam device 5001. The wafer inspection system 5000 or specifically the dual beam device 5001 can be used for box 3005 of FIG. 2. For a wafer 5008, several measurement sites, including measurement sites 5006.1 and 5006.2, are defined in a location map or inspection list generated from an inspection tool or from design information. The measurement sites may be provided as control data from a CD-SAXS in-line quality control (cf. FIG. 3: control data 350). The wafer 5008 is placed on a wafer support table 5015. The wafer support table 5015 is mounted on a stage 5155 with actuators and position control 5021. Actuators and mechanisms for precision control 5021 for a wafer stage 5155 such as laser interferometers are known in the art. A control unit 5016 receives information about the actual position of the wafer stage 5155 and is configured to control the wafer stage 5155 and to adjust a measurement site 5006.1 of the wafer 5008 at the intersection point 5043 of the dual-beam device 5001. The dual beam device 5001 is including a FIB column 5050 with a FIB optical axis 5048 and a charged particle beam (CPB) imaging system 5040 with optical axis 5042. At the intersection point 5043 of both optical axes of FIB and CPB imaging system, the wafer surface 5055 is arranged at a slant angle GF to the FIB axis 5048. FIB axis 5048 and CPB imaging system axis 5042 include an angle GFE. In the coordinate system of FIG. 1, the normal to the wafer surface 55 is given by the z-axis. The focused ion beam (FIB) 5051 is generated by the FIB-column 5050 and is impinging under angle GF on the surface 5055 of the wafer 5008. Slanted cross-section surfaces are milled into the wafer by ion beam milling at the inspection site 5006.1 under approximately the slant angle GF at a predetermined y-position, which is controlled by the stage 5155 and position control 5021. In the example of FIG. 1, the slant angle GF is approximately 30°. The actual slant angle of the slanted cross-section surface can deviate from the slant angle GF by up to 1° to 4° due to the beam divergency of the focused ion beam, for example a Gallium-Ion beam, or due to variable material properties with respect to milling along the cross-section surface. With the charged particle beam imaging system 5040, images of the milled surfaces are acquired. In the example of FIG. 5, the charged particle beam imaging system 40 is arranged with its charged particle beam 5044 perpendicular to the wafer surface 5055 and parallel to the z-axis. In other configurations, the optical axis 5042 of the charged particle beam imaging system 40 is arranged at an angle to the z-axis.

During imaging, a beam of charged particles 5044 is scanned by a scanning unit of the charged particle beam imaging system 5040 along a scan path over a cross-section surface of the wafer at measurement site 506.1, and secondary particles as well as back-scattered particles are generated. Particle detector 5017.1 and optional internal particle detector 5017.2 collect at least some of the secondary particles and/or backscattered particles and communicate the particle count with a control unit 5019. Other detectors for other kinds of interaction products such as x-rays or photons may be present as well. Control unit 5019 is in control of the charged particle beam imaging column 5040 and of the FIB column 5050 and connected to a control unit 5016 to control the position of the wafer mounted on the wafer support table 5015 via the wafer stage 5155. Operation control unit 5002 communicates with control unit 5019, which triggers placement and alignment for example of measurement site 5006.1 of the wafer 5008 at the intersection point 5043 via wafer stage movement and triggers repeatedly operations of FIB milling, image acquisition and stage movements. Control unit 5019 and Operation control unit 5002 includes a memory for storing instructions in form of software code and at least one processer to execute during operation the instructions. A memory is further provided to store digital image data. Operation control unit 5002 may further include a user interface or an interface to other communication interfaces to receive instructions, prior information and to transfer inspection results.

Each new cross-section surface is milled by the FIB beam 5051, and imaged by the charged particle imaging beam 5044, which is for example scanning electron beam or a Helium-Ion-beam of a Helium ion microscope (HIM).

The operation control unit 5002 is configured to perform a 3D inspection inside an inspection volume 5160 in a wafer 5008. The operation control unit 2 is further configured to reconstruct the properties of semiconductor structures of interest from the 3D volume image. In an example, features and 3D positions of the semiconductor structures of interest, for example the positions of the HAR structures, are detected by the image processing methods, for example from HAR centroids. A 3D volume image generation including image processing methods and feature based alignment is further described in WO 2020/244795 A1, which is hereby incorporated by reference.

Figure 6:
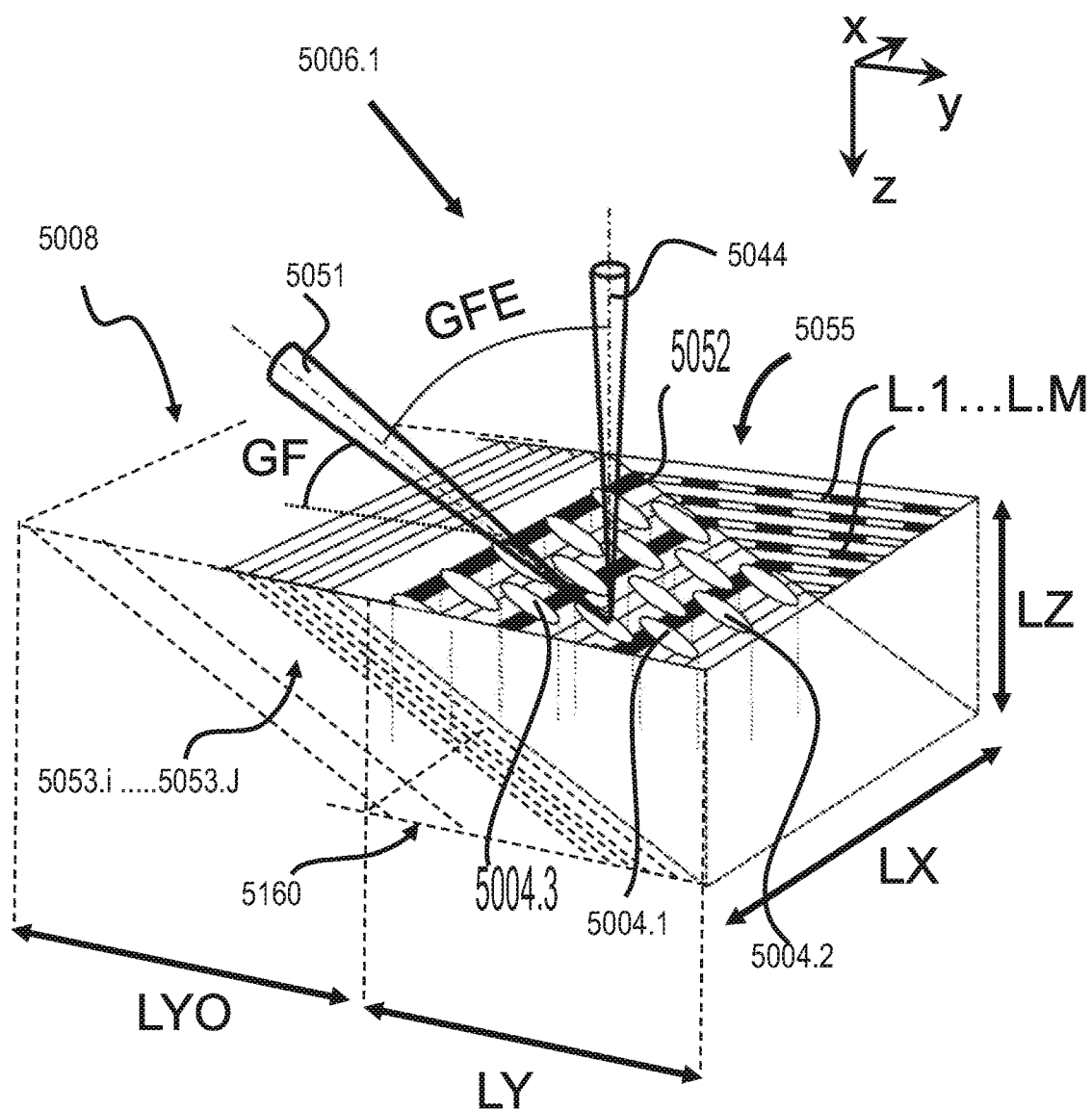
FIG. 6 schematically illustrates a slice-and image measurement according to various examples.

FIG. 6 illustrate further details of the slice-and-imaging measurement in the wedge cut geometry. By repetition of the slicing and imaging method in wedge-cut geometry, a plurality of J cross-section averaged image slices including averaged image slices of cross-section surfaces 5052, 5053.i . . . 5053.J is generated and a 3D volume image of an inspection volume 5160 at an inspection site 5006.1 of the wafer 5008 is generated. FIG. 6 illustrates the wedge cut geometry at the example of a 3D-memory stack. The cross-section surfaces 5053.1 . . . 5053.J are milled with a FIB beam 5051 at an angle GF of approximately 30° to the wafer surface 5055, but other angles GF, for example between GF=20° and GF=60° are possible as well. FIG. 6 illustrates the situation, when the surface 5052 is the new cross-section surface which was milled last by FIB 5051. The cross-section surface 5052 is scanned for example by SEM beam 5044, and a high-resolution cross-section averaged image slice is generated. The cross-section averaged image slice includes first cross-section image features, formed by intersections with high aspect ratio (HAR) structures or vias (for example first cross-section image features of HAR-structures 504.1, 504.2, and 504.3) and second cross-section image features formed by intersections with layers L.1 . . . L.M, which include for example SiO2, SiN— or Tungsten lines. Some of the lines are also called "word-lines". The maximum number M of layers is typically more than 50, for example more than 100 or even more than 200. The HAR-structures and layers extend throughout most of the inspection volume in the wafer but may include gaps. The HAR structures typically have diameters below 100 nm, for example about 80 nm, or for example 40 nm. The HAR structures are arranged in a regular, for example hexagonal raster with a pitch of about below 300 nm, for example even below 250 nm. The cross-section averaged image slices contain therefore first cross-section image features as intersections or cross-sections of the HAR structures at different depth (Z) at the respective XY-location. In case of vertical memory HAR structures of a cylindrical shape, the obtained first cross-sections image features are circular or elliptical structures at various depths determined by the locations of the structures on the sloped cross-section surface 5052. The memory stack extends in the Z-direction perpendicular to the wafer surface 5055. The thickness d or minimum distances d between two adjacent cross-section averaged image slices is adjusted to values typically in the order of few nm, for example 30 nm, 20 nm, 10 nm, 5 nm, 4 nm or even less. Once a layer of material of predetermined thickness d is removed with FIB, a next cross-section surface 5053.i . . . 5053.J is exposed and accessible for imaging with the charged particle imaging beam 5044.

A plurality of J cross-section averaged image slices acquired in this manner covers an inspection volume of the wafer 5008 at measurement site 506.1 and is used for forming of a 3D volume image of high 3D resolution below for example 10 nm, such as below 5 nm.

The inspection volume 5160 (see FIG. 6) typically has a lateral extension of LX=LY=5 µm to 15 µm in x-y plane, and a depth LZ of 2 µm to 15 µm below the wafer surface 5055. However, the extensions can also be larger and reach for example 50 µm.

Figure 7:
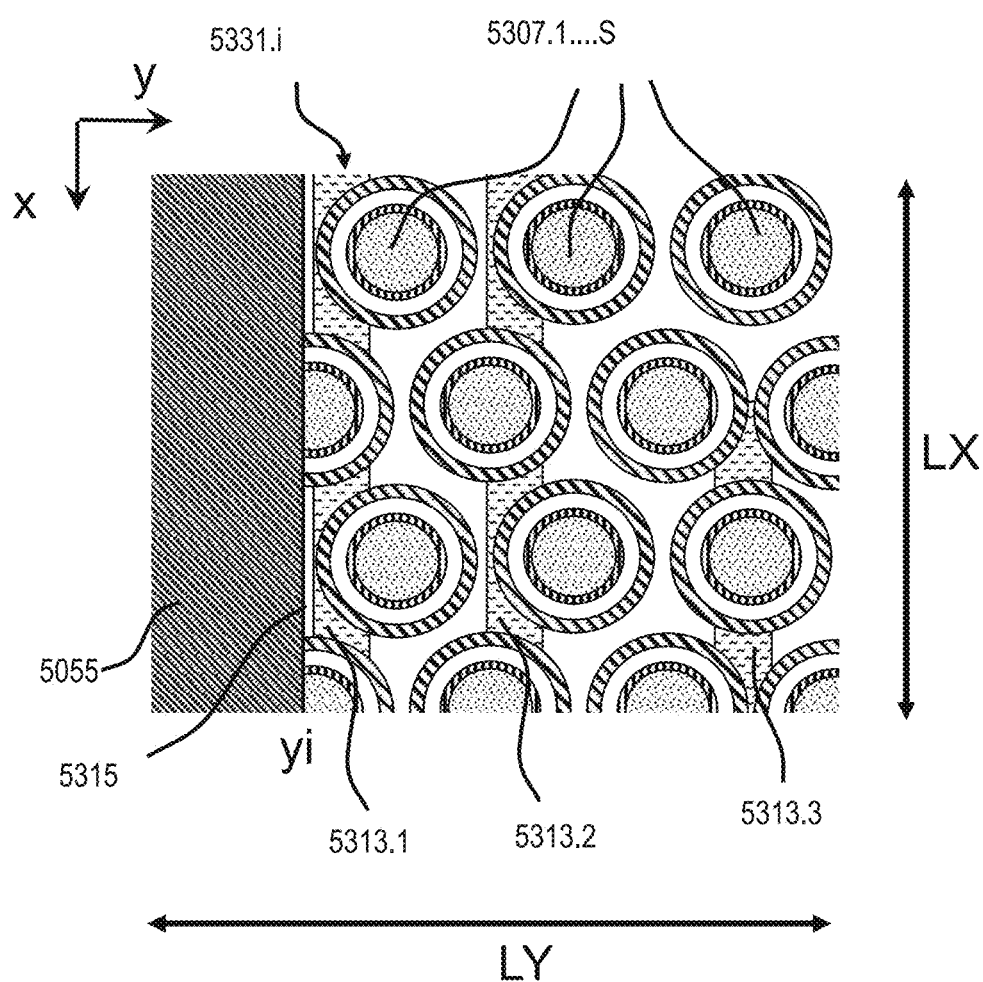
FIG. 7 schematically illustrates an image slice obtained from a slice-and-image measurement according to various examples.

FIG. 7 shows an image slice 5331.i generated by the imaging charged particle beam 44 and corresponding to the i-th cross-section surface 5053.i. The image slice 5311.i includes an edge line 5315 between the slanted cross-section and the surface 5055 of the wafer at the edge coordinate yi. Right to the edge, the image slice 5331.i shows several cross-sections 5307.1 . . . 5307.S through HAR structures which are intersected by the cross-section surface 5301.i. In addition, the image slice 5331.i includes cross sections 5313.1 to 5313.3 of several word lines at different depths or z-positions.

Figure 8:
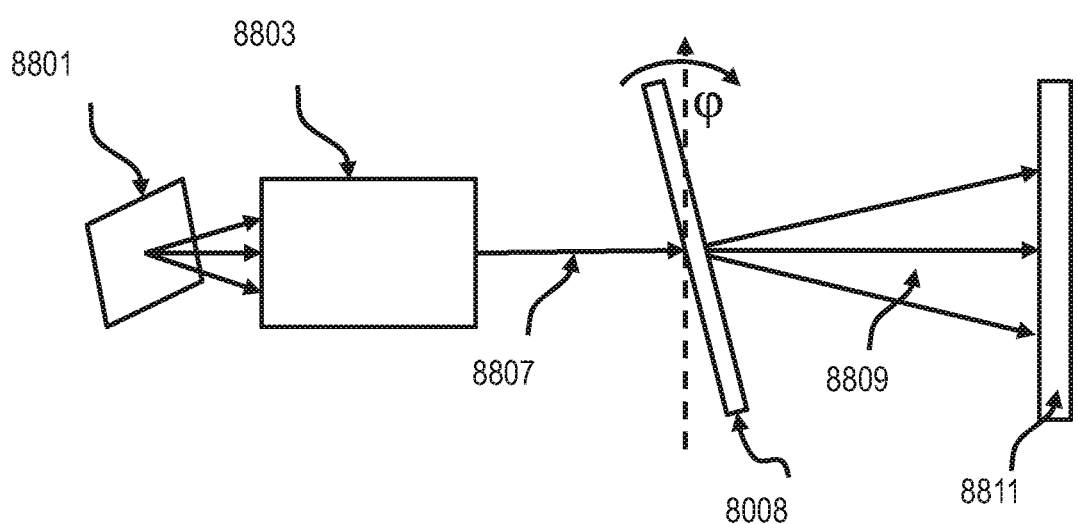
FIG. 8 schematically illustrates an x-ray scattering measurement according to various examples.

FIG. 8 schematically illustrates aspects with respect to the CD-SAXS. FIG. 8 schematically illustrates an x-ray measurement device. This measurement device can be used as is part of box 3015 of FIG. 2. An X-ray source 8801 provides x-rays that are then shaped by x-ray optics 8803. The respective x-ray beam 8807 impinges on the wafer 8008. Thereby, multiple scattered X-rays 8809 are obtained which are detected by a detector 8811, e.g., a scintillator or a solid-state detector.

The wafer 8008 is rotated by angle j at a plurality of rotation angles, a plurality of scattered X-ray spectra are recorded; from the scattered spectra, a form or size of semiconductor features are reconstructed.

Summarizing, techniques have been disclosed that enable executing an in-line wafer metrology using an x-ray scattering measurement based on one or more parameter values that are determined based on 3D volume images of semiconductor structures. The 3D volume images may be obtained through a slice-and-image tomographic measurement.

Using the slice-and-image tomographic measurement allows determining the actual geometrical shapes of the semiconductor structures (geometry) and therefore helps in reducing the reference spectra which is pre-calculated and fitted. Ambiguities in the spectra of the x-ray scattering measurement can be resolved by appropriate selection of imaging parameters.

Although the disclosure has been shown and described with respect to certain embodiments, equivalents and modifications will occur to others skilled in the art upon the reading and understanding of the specification. The present disclosure includes all such equivalents and modifications and is limited only by the scope of the appended claims.

For illustration, while various scenarios have been described with an implementation of x-ray scattering measurement by CD-SAXS, other types of x-ray scattering measurement to may be used. Also, alternatively or additionally to parameterizing an x-ray scattering measurement based on the slice-and-image tomographic measurement, other critical dimensional measurement techniques may be parameterized.

What is claimed is:
1. A method, comprising:
    performing a slice-and-image tomographic measurement to obtain one or more three-dimensional volume images of a wafer comprising semiconductor structures;
    parameterizing an x-ray scattering measurement based on the one or more three-dimensional volume images; and after parameterizing the x-ray scattering measurement, performing the x-ray scattering measurement to obtain one or more measurement spectra of the wafer or one or more further wafers comprising the semiconductor structures or further semiconductor structures, wherein the x-ray scattering measurement is performed in-line of a production line, and the slice-and-image measurement is performed out-of-line of the production line.

2. The method of claim 1, wherein parameterizing the x-ray scattering measurement comprises determining one or more reference spectra based on a geometry of the semiconductor structures determined based on the one or more three-dimensional volume images.

3. The method of claim 2, wherein parameterizing the x-ray scattering measurement comprises determining multiple reference spectra based on a variation of the geometry of the semiconductor structure across the one or more three-dimensional volume images.

4. The method of claim 2, wherein:
the wafer or the one or more further wafers further comprise other semi-conductor structures; and
determining the one or more reference spectra comprises determining a first contribution to the one or more reference spectra associated with the semiconductor structures and determining a second contribution to the one or more reference spectra associated with the other semiconductor structures.

5. The method of claim 2, wherein:
the x-ray scattering measurement is performed multiple times for multiple test volumes of the wafer or the one or more further wafers; and
the method further comprises:
monitoring a match between the measurement spectra obtained for the multiple test volumes and the one or more reference spectra; and
depending on the monitoring, selectively re-performing the slice-and-image measurement to obtain one or more further three-dimensional volume images of at least one of the multiple test volumes; and
determining the geometry of the semiconductor structures based on the one or more further three-dimensional volume images.

6. The method of claim 5, further comprising selectively re-parameterizing the x-ray scattering measurement based on the one or more further three-dimensional volume images.

7. The method of claim 1, wherein parameterizing the x-ray scattering measurement comprises determining an object transfer function of a signal model used to predict one or more reference spectra based on a geometry of the semiconductor structures determined based on the one or more three-dimensional volume images.

8. The method of claim 1, wherein parameterizing the x-ray scattering measurement comprises setting an imaging parameter of the x-ray scattering measurement.

9. The method of claim 8, wherein the imaging parameter is set to resolve ambiguities of the one or more measurement spectra between different geometries of the semiconductor structures determined based on the one or more three-dimensional volume images.

10. The method of claim 8, wherein the imaging parameter comprises at least one member selected from a group consisting of a wavelength of the x-ray radiation, an incidence angle of the x-ray radiation, an acceleration voltage of an x-ray source of the x-ray radiation, a polarization of the x-ray radiation, a diffraction order of the x-ray radiation, a beam shape of the x-ray radiation, and a flux of the x-ray radiation.

11. The method of claim 1, further comprising, based on the one or more measurement spectra, determining a geometry of the semiconductor structures or the further semiconductor structures.

12. The method of claim 1, further comprising, based on the one or more measurement spectra, executing the in-line quality check within a production line of a manufacturing process of the semiconductor structures or the further semiconductor structures.

13. The method of claim 12, wherein the slice-and-image measurement performed out-of-line of the production line is triggered by the in-line quality check.

14. The method of claim 1, wherein the semiconductor structures comprise deep-etched memory channel holes crossing multiple layers of the wafer.

15. One or more non-transitory machine-readable hardware storage devices comprising instructions that are executable by one or more processing devices to perform operations comprising the method of claim 1.

16. A system, comprising:
one or more processing devices; and
one or more machine-readable hardware storage devices comprising instructions that are executable by the one or more processing devices to perform operations comprising the method of claim 1.

\* \* \* \* \*

UNITED STATES PATENT AND TRADEMARK OFFICE
CERTIFICATE OF CORRECTION

| | | |
|---|---|---|
| PATENT NO. | : 12,288,706 B2 | Page 1 of 1 |
| APPLICATION NO. | : 17/729385 | |
| DATED | : April 29, 2025 | |
| INVENTOR(S) | : Hans Michael Stiepan et al. | |

It is certified that error appears in the above-identified patent and that said Letters Patent is hereby corrected as shown below:

In the Specification

Column 1, Line 22, after "the" delete "is".

Column 3, Line 26, delete "slice-and image" and insert -- slice-and-image --.

Column 3, Line 44, after "and" delete "is".

Column 4, Line 8, after "herein" delete "to".

Column 5, Line 26, after "The" delete "is".

Column 12, Line 59, delete "CD-SAXS.The" and insert -- CD-SAXS. The --.

Column 15, Line 7, delete "reis fine" and insert -- refine --.

Column 15, Line 56, delete "slice-" and insert -- slice --.

Column 17, Line 24, delete "5053.1" and insert -- 5053.i --.

Column 18, Line 21, after "as" delete "is".

Column 18, Line 55, after "measurement" delete "to".

Signed and Sealed this
Seventeenth Day of June, 2025

Coke Morgan Stewart
*Acting Director of the United States Patent and Trademark Office*